(12) United States Patent
Singvall et al.

(10) Patent No.: US 6,768,441 B2
(45) Date of Patent: Jul. 27, 2004

(54) METHODS OF RECEIVING COMMUNICATIONS SIGNALS INCLUDING A PLURALITY OF DIGITAL FILTERS HAVING DIFFERENT BANDWIDTHS AND RELATED RECEIVERS

(75) Inventors: Jakob Singvall, Lund (SE); Niklas Stenstrom, Helsingborg (SE)

(73) Assignee: Telefonaktiebolaget L.M. Ericsson, Stockholm (SE)

(*) Notice: Subject to any disclaimer, the term of this patent is extended or adjusted under 35 U.S.C. 154(b) by 0 days.

(21) Appl. No.: 10/224,303

(22) Filed: Aug. 20, 2002

(65) Prior Publication Data

US 2004/0036637 A1 Feb. 26, 2004

(51) Int. Cl.[7] .................................................. H03M 1/12
(52) U.S. Cl. ....................................... 341/155; 375/141
(58) Field of Search ................................. 341/110, 118, 341/143, 144, 155, 141; 375/141, 211, 247, 316, 346, 340, 327

(56) References Cited

U.S. PATENT DOCUMENTS

| | | | |
|---|---|---|---|
| 4,761,829 A | 8/1988 | Lynk, Jr. et al. ............ | 455/307 |
| 5,031,195 A | 7/1991 | Chevillat et al. | |
| 5,451,948 A | 9/1995 | Jekel | |
| 5,509,030 A | 4/1996 | Mortensen | |
| 5,515,046 A * | 5/1996 | Mandl ........................ | 341/143 |
| 5,617,060 A | 4/1997 | Wilson et al. .............. | 330/129 |
| 5,617,090 A * | 4/1997 | Ma et al. .................... | 341/141 |
| 5,905,743 A | 5/1999 | Ramesh | |
| 5,943,324 A * | 8/1999 | Ramesh et al. ............. | 370/321 |
| 5,999,561 A * | 12/1999 | Naden et al. ............... | 375/142 |
| 6,037,886 A | 3/2000 | Staszewski et al. | |
| 6,052,420 A | 4/2000 | Yeap et al. ................. | 375/346 |
| 6,307,599 B1 * | 10/2001 | Komatsu .................... | 348/731 |
| 6,606,359 B1 * | 8/2003 | Nag et al. ................... | 375/348 |
| 6,683,905 B1 * | 1/2004 | King et al. ................. | 375/141 |
| 2002/0041637 A1 * | 4/2002 | Smart et al. ................ | 375/316 |
| 2002/0126778 A1 * | 9/2002 | Ojard et al. ................ | 375/346 |

FOREIGN PATENT DOCUMENTS

| | | | |
|---|---|---|---|
| EP | 0 939 525 | 9/1999 | .......... H04L/25/03 |
| JP | 06-097828 | 4/1994 | |
| JP | 08-125492 | 5/1996 | |
| JP | 2000-307384 | 2/2000 | |
| JP | 2001-308730 | 11/2001 | |
| WO | WO 00/31867 | 6/2000 | |
| WO | WO 01/39448 A1 | 5/2001 | |

OTHER PUBLICATIONS

PCT International Search Report for PCT/EP 03/09069, Dec. 15, 2003.
G. David Forney, Jr.; *Maximum–Likelihood Sequence Estimation of Digital Sequences in the Presence of Intersymbol Interference;* IEEE Transactions on Information Theory, May 1972; vol. IT–18, No. 3; pp. 363–378.
Matthew P. Donadio; *CIC Filter Introduction;* pp 1–6.
EPO Search Report RS 108963 US.

\* cited by examiner

*Primary Examiner*—Michael Tohar
*Assistant Examiner*—Linh V Nguyen
(74) *Attorney, Agent, or Firm*—Myers Bigel Sibley & Sajovec

(57) ABSTRACT

Methods of receiving communications signals can include generating a received analog signal including energy corresponding to communications transmitted from a remote transmitter, and performing an analog-to-digital conversion of the received analog signal to provide a received digital signal. The received digital signal can be digitally filtered using a first digital filter having a first bandwidth to provide a first filtered digital signal, and the first filtered digital signal can be processed to provide an estimate of the communications transmitted from the remote transmitter. The received digital signal can be digitally filtered using a second digital filter having a second bandwidth to provide a second filtered digital signal wherein the second bandwidth is greater than the first bandwidth, and a signal characteristic of the second filtered digital signal can be measured. Related receivers are also discussed.

42 Claims, 4 Drawing Sheets

METHODS OF RECEIVING COMMUNICATIONS SIGNALS INCLUDING A PLURALITY OF DIGITAL FILTERS HAVING DIFFERENT BANDWIDTHS AND RELATED RECEIVERS

BACKGROUND OF THE INVENTION

The present invention relates to the field of communications and more particularly to methods of receiving communications signals and related receivers.

In a conventional receiver, an analog-to-digital converter (ADC) may be used to convert a received analog radio signal into a digital signal for further digital signal processing. An analog-to-digital converter, however, may operate in a limited dynamic range, and if an amplitude of the analog signal exceeds this dynamic range, the resulting digital signal may be distorted. Reception of the radio signal may thus be degraded if the amplitude of the analog signal exceeds the dynamic range of the analog-to-digital converter. In addition, reception of the radio signal may be degraded if the amplitude of the analog radio signal is not a significant portion of the dynamic range such as when the analog radio signal is relatively weak. Accordingly, a receiver should be designed such that a significant portion of the dynamic range of the analog-to-digital converter is used without exceeding the dynamic range of the analog-to-digital converter.

Automatic gain control (AGC) has thus been used to maintain the amplitude of the received analog radio signal within the dynamic range of the analog-to-digital converter. In other words, one or more attenuators and/or amplifiers can be used in an automatic gain control circuit to adjust an amplitude of a received analog radio signal before performing analog-to-digital conversion. The attenuators and/or amplifiers of the automatic gain control circuit can be switched on/off depending on the strength of the received analog radio signal. The signal strength of the received analog radio signal used to provide automatic gain control can be measured in the analog domain of the receiver before analog-to-digital conversion or in the digital domain of the receiver after analog-to-digital conversion.

SUMMARY OF THE INVENTION

According to embodiments of the present invention, methods of receiving communications signals can include generating a received analog signal including energy corresponding to communications transmitted from a remote transmitter, and performing an analog-to-digital conversion of the received analog signal to provide a received digital signal. The received digital signal can be digitally filtered using a first digital filter having a first bandwidth to provide a first filtered digital signal, and the first filtered digital signal can be processed to provide an estimate of the communications transmitted from the remote transmitter. The received digital signal can be digitally filtered using a second digital filter having a second bandwidth to provide a second filtered digital signal wherein the second bandwidth is greater than the first bandwidth, and a signal characteristic of the second filtered digital signal can be measured.

According to additional embodiments of the present invention, the measured signal characteristic can be a received signal strength. Moreover, the measured signal characteristic can be used to adjust a gain of the received analog signal, to adjust the first bandwidth of the first digital filter, to adjust operation of a digital signal processor, and/or to adjust operation of a whitening filter. In addition, each of the first and second digital filters can be selected from the group including a finite impulse response filter, an infinite impulse response filter, a cascaded integrator-comb filter, and/or a realization filter.

DETAILED DESCRIPTION

Figure 1:
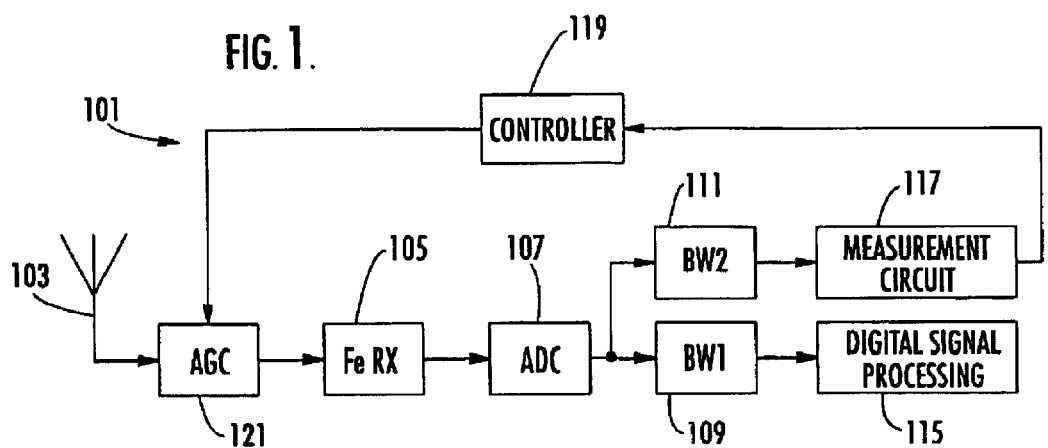
FIG. 1 is a block diagram illustrating receivers and methods according to first embodiments of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As will be appreciated by those of skill in the art, the present invention may be embodied as methods or devices. Accordingly, the present invention may take the form of a hardware embodiment, a software embodiment or an embodiment combining software and hardware aspects. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In a multi-user communications system, a received signal may be a sum of signals generated by different users. Techniques such as code division multiple access (CDMA), time division multiple access (TDMA), frequency division multiple access (FDMA), and/or combinations thereof have been developed to reduce the effects of interference between different users. In an FDMA system, different users may use different parts of the available frequency band, and an FDMA receiver can then filter a desired received signal in a desired frequency band to attenuate interference from other users in other frequency bands using a receiver or channel filter. Accordingly, the desired receive signal can be isolated and processed to generate an estimate of communications transmitted from a remote transmitter. In some embodiments, it may be desirable to perform receiver/channel filtering digitally after analog to digital conversion. Performing receiver/channel filtering after analog-to-digital conversion, for example, may provide reduced cost, reduced size, reduced power consumption, and/or improved reliability as opposed to providing analog receiver/channel filtering.

When performing automatic gain control, the received signal strength can be measured prior to or after analog-to-digital conversion. When measuring the signal strength prior to analog-to-digital conversion, accuracy of the measurement may be limited due to component variations. Moreover, measurement of the analog received signal may be more expensive than measurement of the digital signal because additional components may need to be introduced and because analog devices may be comparatively more expensive. Moreover, measurement of the analog signal may require an additional analog-to-digital conversion to provide logical operations for automatic gain control.

If the received signal strength is measured in the digital domain, a sampling frequency of the analog-to-digital converter may need to be increased, especially in a direct conversion receiver. The converted digital signal may thus need to be interpolated and downsampled. These operations may be carried out in a digital receive/channel filter. The receive/channel filter, however, may be provided to attenuate interference from other users operating on frequencies other than the frequency over which the desired signal is being received. In other words, the receive/channel filter may attenuate portions of the received signal outside a frequency band used to communicate the desired signals being received.

Received signal strength measurements taken in the digital domain after the receive/channel filter operation may thus not represent signal energy outside the frequency band used to communicate the desired signals being received. A strong interfering signal may thus not be included in the signal strength measurement because it has been attenuated by the receive/channel filter. Accordingly, the automatic gain control may provide too much gain (or too little attenuation) so that the input to the analog-to-digital converter exceeds the dynamic range of the analog-to-digital converter thereby causing the analog-to-digital converter to go into compression and introducing distortion that may reduce receiver performance.

According to embodiments of the present invention illustrated in FIG. 1, a receiver 101 can include an antenna 103, a receiver front end 105, an analog-to-digital converter 107, first and second digital filters 109 and 111, digital signal processor 115, signal strength measurement circuit 117, controller 119, and automatic gain control circuit 121. Radio signals from the antenna 103 can thus be applied to the automatic gain control circuit 121 and to the receiver front end 105. By varying a gain/attenuation applied to radio signals at the automatic gain control circuit 121, the amplitude of the received analog signal applied to the input of the analog-to-digital converter 107 can be maintained within the dynamic range of the analog-to-digital converter 107 without exceeding or falling below a desirable threshold.

The analog-to-digital converter 107 can convert the received analog signal to a received digital signal, and the first digital filter 109 can have a first bandwidth such that the first digital filter provides a first filtered digital signal representing portions of the received digital signal within the first bandwidth and including energy corresponding to communications transmitted from a desired remote transmitter. The first filtered digital signal can then be processed by the digital signal processor 115 to provide an estimate of the communications transmitted from the desired remote transmitter. The estimate of the communications transmitted from the desired remote transmitter can then be used to generate voice communications, a data stream, video, audio, graphics, or any other communications transmitted by the desired remote transmitter.

As shown in FIG. 1, the received digital signal generated by the analog-to-digital converter 107 is also applied to a second digital filter 111 having a second bandwidth BW2 greater than the first bandwidth BW1 of the first digital filter 109. In particular, the first digital filter can have a first frequency bandwidth corresponding to a frequency bandwidth over which the communications from the desired remote transmitter are transmitted, and the second digital filter can have a frequency bandwidth that is wider than the first frequency bandwidth wherein the second frequency bandwidth includes all of the first frequency bandwidth so that the output of the second filtered digital signal includes a representation of all energy represented by the first filtered digital signal plus additional energy outside the first frequency bandwidth. More particularly, the first and second frequency bandwidths can have a same center frequency.

The first and second digital filters 109 and 111, for example, can be cascaded integrator-comb (CIC) filters, finite impulse response (FIR) filters, infinite response filters (IIR), realization filters, and/or combinations thereof. According to particular embodiments of the present invention, the first and second digital filters 109 and 111 can be of a common digital filter type having a common center frequency but with different bandwidths. Operations of a CIC Filter are discussed, for example, by Matthew P. Donadio in "CIC Filter Introduction" (m.p.donadio@ieee.org, pages 1–6, Jul. 18, 2000), the disclosure of which is hereby incorporated herein in its entirety by reference. More particularly, the first digital filter 109 can have a first bandwidth BW1, and the second digital filter 111 can have a second bandwidth BW2 such that BW1<BW2.

The signal strength measurement circuit 117 can thus measure a signal strength over the second bandwidth BW2 that is greater than the first bandwidth BW1 used for digital signal processing. The resulting signal strength measurement (measured over bandwidth BW2) can then be provided to the controller 119 and used to control operation of the automatic gain control circuit 121. As the measured signal strength provided by the signal strength measurement circuit 117 increases, the controller 119 can increase an attenuation (and/or decrease a gain) applied by the automatic gain control circuit 121. Conversely, as the measured signal strength provided by the signal strength measurement circuit 117 decreases, the controller 119 can decrease an attenuation (and/or increase a gain) applied by the automatic gain control circuit 121.

Accordingly, a signal strength measurement can be based on the output of the second digital filter 111 so that the signal strength measurement includes energy outside the bandwidth passed by the first digital filter 109. Improved operation of the automatic gain control circuit 121 and improved receiver performance can thus be provided without negatively affecting generation of the received communications by the digital signal processor 115. In other words, the first digital filter 109 has a first bandwidth BW1 chosen to provide desired receive/channel filter characteristics for generating estimates of the received communication, while that second digital filter 111 has a second bandwidth BW2 chosen to provide improved measurement of received signal strength and to provide improved control of the automatic gain control circuit.

The output of a single analog-to-digital converter can thus be used to provide both an input for digital signal processing to generate the receive communication and to provide an input for calculating a received signal strength for automatic gain control. Expense can thus be reduced because two analog-to-digital converters may not be required, and an additional analog filter may not be required.

In addition, determination of the automatic gain control operation can be based on a measurement of signal strength including measurement of energy outside the bandwidth of the first digital filter so that automatic gain control circuit 121 can apply an appropriate gain/attenuation to maintain an input to the analog-to-digital converter 107 within a dynamic range of the analog-to-digital converter 107. In other words, the input to the analog-to-digital converter includes energy outside the bandwidth of the first digital filter 109 so that improved control of the attenuation/gain of the input to the analog-to-digital converter can consider received signal energy outside the bandwidth of the first digital filter.

Functionality of the first and second digital filters can be implemented in a single integrated circuit device or in different integrated circuit devices. In addition, functionality of the first digital filter and the digital signal processor can be implemented in a single integrated circuit device or in different integrated circuit devices. Moreover, the second digital filter, the measurement circuit, the controller, and/or the automatic gain control circuit can be implemented in one or more integrated circuit devices. Similarly, functionality of different blocks can be combined within a single block. For example, functionality of the measurement circuit, the controller, and/or the automatic gain control circuit can be combined into a single block.

Figure 2:
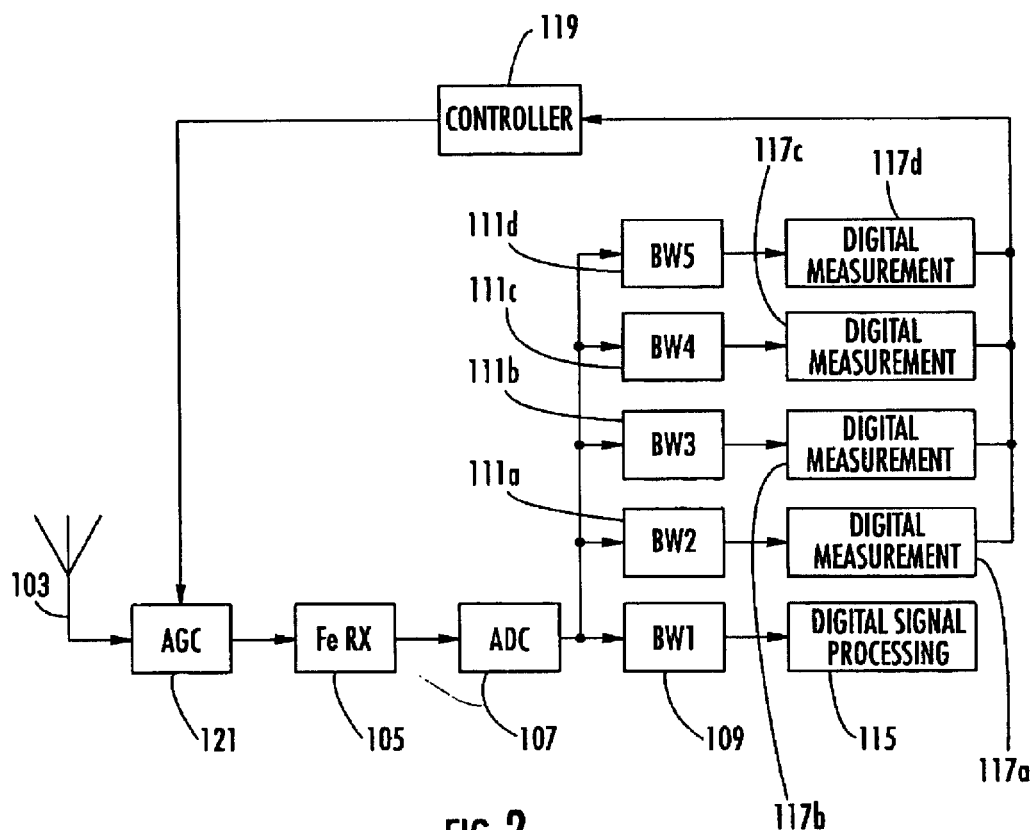
FIG. 2 is a block diagram illustrating receivers and methods according to second embodiments of the present invention.

According to embodiments of the present invention illustrated in FIG. 2, a first digital filter 109 having a bandwidth BW1 can be provided as discussed above, and a plurality of additional digital filters 111a–d can be provided having a plurality of different bandwidths BW2–5 all greater than the bandwidth BW1 of the first digital filter 109. A plurality of signal strength measurement circuits 117a–d can thus generate respective signal strength measurements based on signal energy within each of the bandwidths BW2–5. A desired one of the signal strength measurements can then be used by controller 119 to control the attenuation/gain applied by the automatic gain control circuit 121. Alternatively, the controller can use a combination of the signal strength measurements to control the attenuation/gain applied by the automatic gain control circuit 121.

In other words, different signal strength measurements can be based on energy in different frequency bandwidths to provide more accurate gain control. By way of example, a communication system may provide that center frequencies of adjacent carriers are separated by 200 kHz, and the first digital filter 109 may have a bandwidth of 50 kHz and a center frequency corresponding to a center frequency of a carrier being received to provide desired receive/channel filter characteristics. The additional filters 111a–d can have the same center frequency as the first digital filter 109 with increasing bandwidths. For example, bandwidths BW2–5 of the additional digital filters 111a–d can be 100 kHz, 300 kHz, 500 kHz, and 700 kHz respectively.

Figure 3:
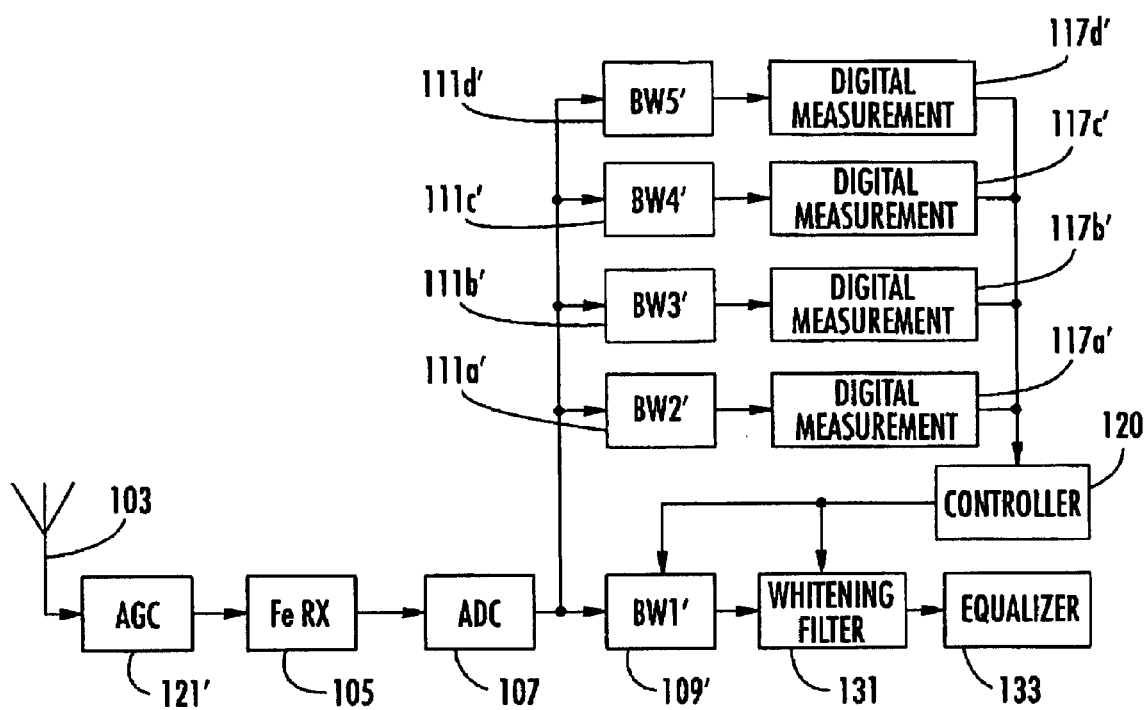
FIG. 3 is a block diagram illustrating receivers and methods according to third embodiments of the present invention.

According to embodiments of the present invention illustrated in FIG. 3, additional digital filters 111a'-d' have different bandwidths BW2'–5' that are larger than a bandwidth BW1' of first digital filter 109'. The signal strength measurement circuits 117a'-d' may generate signal strength measurements based on signal energy within the different bandwidths BW2'–5' as discussed above. The signal strength measurements of measurement circuits 117a'-d' of FIG. 3, however, provide information to controller 120 that can be used to adjust operations of the first digital filter 109' and/or a whitening filter 131. Operations of whitening filters are discussed, for example, in International Application No. PCT/US00/26776 to Dennis Hui et al. entitled "Methods, Receiver Devices And Systems For Whitening A Signal Disturbance In A Communication Signal" (corresponding to U.S. application Ser. No. 09/450,684); U.S. Pat. No. 5,905,743 to Rajaram Ramesh entitled "Apparatus, Methods And Computer Program Products For Sequential Maximum Likelihood Estimating Communications Signals Using Whitening Path Metrics"; G. David Forney, Jr., "Maximum-Likelihood Sequence Estimation Of Digital Sequences In The Presence Of Intersymbol Interference", IEEE TRANS. INFOR. THEORY, vol. IT-18, No. 3, May 1972; and U.S. Pat. No. 5,031,195 to Pierre R. Chevillat et al. entitled "Fully Adaptive Modem Receiver Using Whitening Matched Filtering". The disclosures of each of these references are hereby incorporated herein in their entirety by reference.

As shown in FIG. 3, the automatic gain control circuit 121' and receiver front end 105 provide a received analog signal to the analog-to digital converter 107, and the analog-to-digital converter 107 converts the received analog signal to a received digital signal that is filtered by the first digital filter 109' to provide a receive/channel filter function. The first digital filter 109' can have a first bandwidth BW1' and a first center frequency corresponding to that of a carrier channel over which communications are being received. The output of the first digital filter 109' can then be provided to whitening filter 131 and equalizer 133 to generate estimates of communications transmitted from a desired remote transmitter.

Digital filters 111a'-d' each have bandwidths BW2'–5' greater than bandwidth BW1' of digital filter 109'. Moreover, digital filters 111a'-d' can each have a different bandwidth. The output of each of the digital filters 111a'-d' can be applied to a respective signal strength measurement circuit 117a'-d' which generate respective signal strength measurements based on energy received over the respective bandwidths.

Performance of the receiver can be improved by adjusting operating characteristics of the first digital filter 109' and/or the whitening filter 131 responsive to signal strength measurements of energy received over one or more bandwidths greater than the bandwidth of the first digital filter 109'. If the received signal strength measurements are used to adjust the whitening filter, complexity of the whitening filter 131 can thus be reduced based on knowledge of the presence and/or absence of adjacent interferes. Reliance on characterization of interferers at the equalizer after receive/channel filtering can thus be reduced. If the received signal strength measurements are used to adjust the first digital filter 109' providing receive/channel filtering, the bandwidth of the first digital filter can be changed based on the presence and/or absence of adjacent channel interferers. A narrower bandwidth for the first digital filter can be used, for example, if an adjacent channel interferer is present, and a wider bandwidth can be used if there are no adjacent channel interferers present.

While not shown in FIG. 3, signal strength measurements generated by one or more of the strength measurement circuits 117a'-d' can be used to adjust operations of the automatic gain control circuit 121' as discussed above with regard to FIGS. 1 and 2. Similarly, signal strength measurements of digital filter 111 of FIG. 1 or signal strength measurements of one or more of digital filters 111a–d can be used to adjust operations of the respective digital signal processors. The digital signal processors of FIGS. 1 and 2, for example, can include respective whitening filters and/or equalizers, the operations of which may be adjusted based on signal strength measurements generated by the respective strength measurement circuits.

Figure 4:
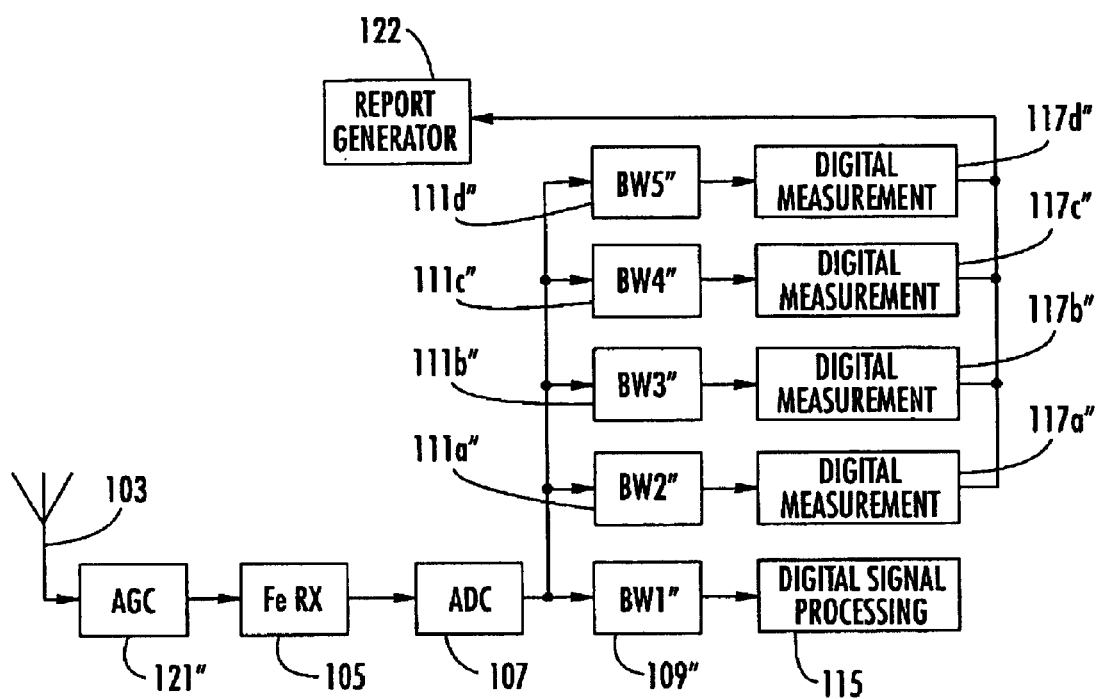
FIG. 4 is a block diagram illustrating receivers and methods according to fourth embodiments of the present invention.

According to embodiments of the present invention illustrated in FIG. 4, the automatic gain control circuit 121" and receiver front end 105 provide a received analog signal to the analog-to digital converter 107, and the analog-to-digital converter 107 converts the received analog signal to a received digital signal that is filtered by the first digital filter 109" that provides a receive/channel filter function. The first digital filter 109" can have a first bandwidth BW1" and a first center frequency corresponding to that of a carrier frequency over which communications are being received. The output of the first digital filter 109" can then be provided to digital signal processor 115 to generate estimates of communications transmitted from a remote transmitter.

Digital filters 111a"-d" each have bandwidths BW2"-5" greater than bandwidth BW1" of digital filter 109". Moreover, digital filters 111a"-d" can each have a different bandwidth. The output of each of the digital filters 111a"-d" can be applied to a respective signal strength measurement circuit 117a"-d" which generate respective signal strength measurements based on energy received over the respective bandwidths. Accordingly, levels of multiple adjacent channel interferers at different frequencies can be measured. In a communications system where adjacent channel center frequencies are separated by 200 kHz, for example, interferers at 200 kHz, 400 kHz, and 600 kHz from the desired carrier can be measured. The signal strength measurements can then be provided to report generator 122 that may generate and/or store cell measurement information.

The receiver of FIG. 4, for example, can be used by a wireless service provider operating a cellular radiotelephone system to collect information regarding adjacent channel interference within cells of the system. The digital filters 111a"-d", for example, can have respective bandwidths BW2"=100 kHz, BW3"=300 kHz, BW4"=500 kHz, and BW5"=700 kHz, and the respective signal strength measurement circuits can measure interference levels in a Global System for Mobile Communications (GSM system) with a separation of 200 kHz between adjacent carriers. Measurements from one or more of the measurement circuits 117a"-d" can also be used to vary operations of the first digital filter 109", the digital signal processor 115, and/or the automatic gain control circuit 121".

According to embodiments of the present invention illustrated in FIGS. 1–4, digital filters 109, 109', 109", 111, 111a–d, 111a'-d', and 111a"-d" can be implemented as cascaded integrator-comb (CIC) filters, finite impulse response (FIR) filters, infinite response filters (IIR), realization filters, and/or combinations thereof. According to particular embodiments, each of the digital filters can be a cascaded integrator-comb filter. When implementing a receiver as illustrated in any of FIGS. 2–4, a single digital filter with a bandwidth greater than that of the respective first digital filter 109, 109', or 109" can be used in combination with a single measurement circuit to vary operations of an automatic gain control circuit, a whitening filter, and/or the first digital filter, and/or to provide a report of interference within a network.

Figure 5:
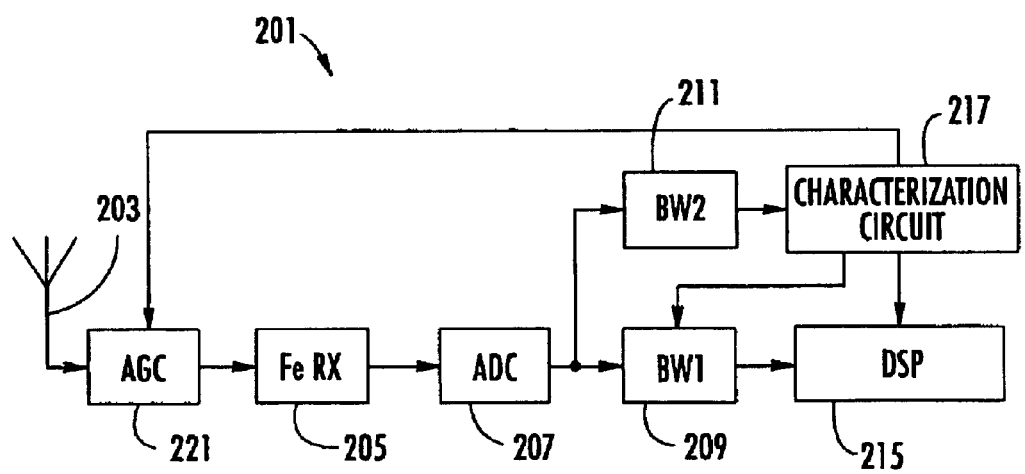
FIG. 5 is a block diagram illustrating receivers and methods according to fifth embodiments of the present invention.

According to embodiments of the present invention illustrated in FIG. 5, a receiver 201 can include an antenna 203, a receiver front end 205, an analog-to-digital converter 207, first and second digital filters 209 and 211, digital signal processor 215, characterization circuit 217, and automatic gain control circuit 221. The first digital filter 209 can have a first bandwidth BW1 such that the first digital filter provides a first filtered signal representing portions of the received digital signal from the analog-to-digital converter within the first bandwidth and corresponding to communications transmitted from a desired remote transmitter. The second digital filter 211 can have a second bandwidth BW2 greater than the first bandwidth BW1. Moreover, the first and second bandwidths can have a common center frequency.

The output of the first digital filter can be provided to the digital signal processor 215 to generate estimates of the communications transmitted from the desired transmitter. The output of the second digital filter having the greater bandwidth can be provided to the characterization circuit 217, and the characterization circuit can provide a characterization of some aspect of the signal received over the second bandwidth BW2. The characterization circuit 217, for example, can provide a measurement of signal strength. The characterization of the received signal can then be used to vary operation of one or more of the automatic gain control circuit 221, the first digital filter 209, and/or the digital signal processor 215. While couplings are shown from the characterization circuit 217 to the automatic gain control circuit 221, the first digital filter 209, and the digital signal processor 215, not all connections are required according to embodiments of the present invention. Moreover, the characterization circuit 217 may be used to provide a report of the signal characterizations without varying operations of other components such that none of the couplings from output(s) of the characterization circuit 217 to the automatic gain control circuit 221, first digital filter 209, and digital signal processor 215 are required according to additional embodiments of the present invention.

In the receiver of FIG. 5, additional digital filters may be provided between the output of the analog-to-digital converter 207 and the characterization circuit 217 such that signal characterization generated by the characterization circuit may be based on a plurality of filter outputs wherein the additional filters have different bandwidths. In addition, the output of the first digital filter 209 can be provided to the characterization circuit 217 so that the characterization is based on output from the first digital filter in addition to output from the second digital filter. Moreover, the characterization circuit may generate a single output based on input from one or more digital filters, or the characterization circuit may generate a different characterization corresponding to each of the inputs thereto if multiple inputs are provided.

In the receivers of FIGS. 1–5, the first digital filter has a pass frequency and bandwidth corresponding to a frequency and bandwidth of a channel over which communications are being received, and these receivers may be used in systems wherein communications are received over different channels having different frequencies. Accordingly, the pass frequency of the first digital filter may be selected from one of a plurality of channel frequencies corresponding to the particular channel frequency over which communications are being received at the time. For example, the first digital filter may be set to a first frequency at a first time when receiving communications over the first frequency, and then set to a second frequency at a second time when receiving communications over the second frequency. Similarly, the center frequencies of the second digital filter (and any other additional filters) can be set to the frequency being received with the bandwidth thereof being greater than the bandwidth of the first digital filter. Receivers according to embodiments of the present invention can thus be used in wireless communications devices such as cellular radiotelephones that receive communications over different frequency channels at different times.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of receiving communications signals, the method comprising:
   generating a received analog signal including energy corresponding to communications transmitted from a remote transmitter;
   performing an analog-to-digital conversion of the received analog signal to provide a received digital signal;
   digitally filtering the received digital signal using a first digital filter having a first bandwidth to provide a first filtered digital signal;
   processing the first filtered digital signal to provide an estimate of the communications transmitted from the remote transmitter;
   digitally filtering the received digital signal using a second digital filter having a second bandwidth to provide a second filtered digital signal wherein the second bandwidth is greater than the first bandwidth; and
   measuring a signal characteristic of the second filtered digital signal.

2. A method according to claim 1 further comprising:
   adjusting a gain of the received analog signal based on the measured signal characteristic of the second filtered digital signal.

3. A method according to claim 1 further comprising:
   adjusting the first bandwidth of the first digital filter based on the measured signal characteristic of the second filtered digital signal.

4. A method according to claim 1 wherein processing the first filtered digital signal comprises performing a whitening filter function, the method further comprising:
   adjusting operation of the whitening filter function based on the measured signal characteristic of the second filtered digital signal.

5. A method according to claim 1 further comprising:
   digitally filtering the received digital signal using a third digital filter having a third bandwidth to provide a third filtered digital signal wherein the third bandwidth is greater than the second bandwidth; and
   measuring a signal characteristic of the third filtered digital signal.

6. A method according to claim 1 wherein each of the first and second digital filters is selected from the group consisting of a finite impulse response filter, an infinite impulse response filter, a cascaded integrator-comb filter, and/or a realization filter.

7. A method according to claim 1 wherein each of the first and second digital filters comprises a cascaded integrator-comb filter.

8. A method according to claim 1 wherein the energy corresponding to the communications transmitted from the remote transmitter is transmitted over a communications channel within the first bandwidth.

9. A method according to claim 1 further comprising:
   generating speech responsive to the estimate of the communications transmitted from the remote transmitter.

10. A method according to claim 1 further comprising:
    generating a digital data stream responsive to the estimate of the communications transmitted from the remote transmitter.

11. A method according to claim 1 wherein the received analog signal comprises a received analog radio signal.

12. A method according to claim 1 wherein measuring a signal characteristic comprises measuring a signal strength of the second filtered digital signal.

13. A method according to claim 1 wherein measuring a signal characteristic comprises measuring adjacent channel interference.

14. A method according to claim 1 wherein the first bandwidth of the first digital filter is included within the second bandwidth of the second digital filter.

15. A method according to claim 1 wherein the first and second digital filters digitally filter the same received digital signal.

16. A receiver according to claim 1 wherein the first and second digital filters digitally filter the same received digital signal.

17. A receiver comprising:
    a receiver configured to generate a received analog signal including energy corresponding to communications transmitted from a remote transmitter;
    an analog-to-digital converter configured to convert of the received analog signal to provide a received digital signal;
    a first digital filter having a first bandwidth and configured to digitally filter the received digital signal to provide a first filtered digital signal;
    a digital signal processor configured to process the first filtered digital signal to provide an estimate of the communications transmitted from the remote transmitter;
    a second digital filter having a second bandwidth and configured to digitally filter the received digital signal to provide a second filtered digital signal wherein the second bandwidth is greater than the first bandwidth; and
    a characterization circuit configured to measure a signal characteristic of the second filtered digital signal.

18. A receiver according to claim 17 comprising:
    an automatic gain control circuit configured to adjust a gain of the received analog signal based on the measured signal characteristic of the second filtered digital signal.

19. A receiver according to claim 17 wherein the first bandwidth of the first digital filter is adjusted based on the measured signal characteristic of the second filtered digital signal.

20. A receiver according to claim 17 wherein the digital signal processor is further configured to perform a whitening filter function, wherein the digital signal processor is further configured to adjust operation of the whitening filter function based on the measured signal characteristic of the second filtered digital signal.

21. A receiver according to claim 17 further comprising:
    a third digital filter having a third bandwidth and configured to digitally filter the received digital signal to provide a third filtered digital signal wherein the third bandwidth is greater than the second bandwidth; and
    a second characterization circuit configured to measure a signal characteristic of the third filtered digital signal.

22. A receiver according to claim 17 each of the first and second digital filters is selected from the group consisting of a finite impulse response filter, an infinite impulse response filter, a cascaded integrator-comb filter, and/or a realization filter.

23. A receiver according to claim 17 wherein each of the first and second digital filters comprises a cascaded integrator-comb filter.

24. A receiver according to claim 17 wherein the energy corresponding to the communications transmitted from the remote transmitter is transmitted over a communications channel within the first bandwidth.

25. A receiver according to claim 17 measuring a signal characteristic comprises measuring a signal strength of the second filtered digital signal.

26. A receiver according to claim 17 wherein measuring a signal characteristic comprises measuring adjacent channel interference.

27. A receiver according to claim 17 wherein the first bandwidth of the first digital filter is included within the second bandwidth of the second digital filter.

28. A receiver according to claim 27 wherein the first and second bandwidths have a same center frequency.

29. A receiver according to claim 17 wherein the first and second digital filters digitally filter the same received digital signal.

30. A receiver of receiving communications signals, the receiver comprising:
means for generating a received analog signal including energy corresponding to communications transmitted from a remote transmitter;
means for performing an analog-to-digital conversion of the received analog signal to provide a received digital signal;
means for digitally filtering the received digital signal using a first digital filter having a first bandwidth to provide a first filtered digital signal;
means for processing the first filtered digital signal to provide an estimate of the communications transmitted from the remote transmitter;
means for digitally filtering the received digital signal using a second digital filter having a second bandwidth to provide a second filtered digital signal wherein the second bandwidth is greater than the first bandwidth; and
measuring a signal characteristic of the second filtered digital signal.

31. A receiver according to claim 30 further comprising:
means for adjusting a gain of the received analog signal based on the measured signal strength of the second filtered digital signal.

32. A receiver according to claim 30 further comprising:
means for adjusting the first bandwidth of the first digital filter based on the measured signal strength of the second filtered digital signal.

33. A receiver according to claim 30 wherein processing the first filtered digital signal comprises performing a whitening filter function, the receiver further comprising:
means for adjusting operation of the whitening filter function based on the measured signal strength of the second filtered digital signal.

34. A receiver according to claim further comprising:
means for digitally filtering the received digital signal using a third digital filter having a third bandwidth to provide a third filtered digital signal wherein the third bandwidth is greater than the second bandwidth; and
means for measuring a signal strength of the third filtered digital signal.

35. A receiver according to claim 30 wherein each of the first and second digital filters is selected from the group consisting of a finite impulse response filter, an infinite impulse response filter, a cascaded integrator-comb filter, and/or a realization filter.

36. A receiver according to claim 30 wherein each of the first and second digital filters comprises a cascaded integrator-comb filter.

37. A receiver according to claim 30 wherein the energy corresponding to the communications transmitted from the remote transmitter is transmitted over a communications channel within the first bandwidth.

38. A receiver according to claim 30 wherein measuring a signal characteristic comprises measuring a signal strength of the second filtered digital signal.

39. A receiver according to claim 14 wherein measuring a signal characteristic comprises measuring adjacent channel interference.

40. A method according to claim 14 wherein the first and second bandwidths have a same center frequency.

41. A receiver according to claim 30 wherein the first bandwidth of the first digital filter is included within the second bandwidth of the second digital filter.

42. A receiver according to claim 41 wherein the first and second bandwidths have a same center frequency.

* * * * *

UNITED STATES PATENT AND TRADEMARK OFFICE
CERTIFICATE OF CORRECTION

PATENT NO. : 6,768,441 B2
DATED : July 27, 2004
INVENTOR(S) : Singvall et al.

It is certified that error appears in the above-identified patent and that said Letters Patent is hereby corrected as shown below:

Column 10,
Line 14, should read -- 16. A receiver according to claim 30 wherein the first and --
Line 38, should read -- 18. A receiver according to claim 17 further comprising: --

Column 11,
Line 19, should read -- 30. A receiver for receiving communications signals, the --

Column 12,
Line 11, should read -- 34. A receiver according to claim 30 further comprising: --
Line 33, should read -- 39. A receiver according to claim 30 wherein measuring --

Signed and Sealed this

Twenty-eighth Day of December, 2004

JON W. DUDAS
*Director of the United States Patent and Trademark Office*